United States Patent
Yang et al.

[19]

[11] Patent Number: 6,147,372

[45] Date of Patent: *Nov. 14, 2000

[54] LAYOUT OF AN IMAGE SENSOR FOR INCREASING PHOTON INDUCED CURRENT

[75] Inventors: Hua-Yu Yang, Kaohsiung County; Chih-Heng Shen, Shin-Chu; Wen-Cheng Chang, Hsin-Chu, all of Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/246,293

[22] Filed: Feb. 8, 1999

[51] Int. Cl.[7] .................. H01L 27/148; H01L 29/768; H01L 29/80; H01L 31/112; H01L 31/288

[52] U.S. Cl. .................. 257/232; 257/257; 257/258; 257/465; 257/654

[58] Field of Search ................... 257/465, 654, 257/232, 344, 257, 258

[56] References Cited

U.S. PATENT DOCUMENTS

| | | | |
|---|---|---|---|
| 2,897,421 | 7/1959 | Kruper | 257/462 |
| 4,096,512 | 6/1978 | Polinsky | 357/30 |
| 4,099,986 | 7/1978 | Diepers | 136/89 TF |
| 4,590,327 | 5/1986 | Nath et al. | 136/256 |
| 5,065,206 | 11/1991 | Nishizawa et al. | 357/30 |
| 5,270,221 | 12/1993 | Garcia et al. | 437/2 |
| 5,424,223 | 6/1995 | Hynecek | 437/3 |
| 5,426,060 | 6/1995 | Kawahara et al. | 437/8 |
| 5,789,263 | 8/1998 | Kuo et al. | 437/3 |
| 5,797,998 | 8/1998 | Wenham et al. | 136/255 |
| 5,844,234 | 12/1998 | Kawazoe | 250/208.1 |
| 5,912,492 | 6/1999 | Chang et al. | 257/344 |

*Primary Examiner*—Mahshid Saadat
*Assistant Examiner*—Jesse A Fenty
*Attorney, Agent, or Firm*—George O. Saile; Stephen B. Ackerman; Larry J. Prescott

[57] ABSTRACT

Device layouts are described which increase the photon current of a metal oxide semiconductor image sensor. The metal oxide semiconductor can be NMOS, PMOS, or CMOS. The key part of the photon current of the image sensors comes from the depletion region at the PN junction between the drain region and the substrate material. The layouts used significantly increase the area of this depletion region illuminated by a stream of photons. The layouts have a drain region which takes the shape of a number of parallel fingers perpendicular to the gate electrode, a number of parallel fingers parallel to the gate electrode, or a spiral. The drain regions of these layouts significantly increase the area of the drain depletion region illuminated by a stream of electrons.

21 Claims, 6 Drawing Sheets

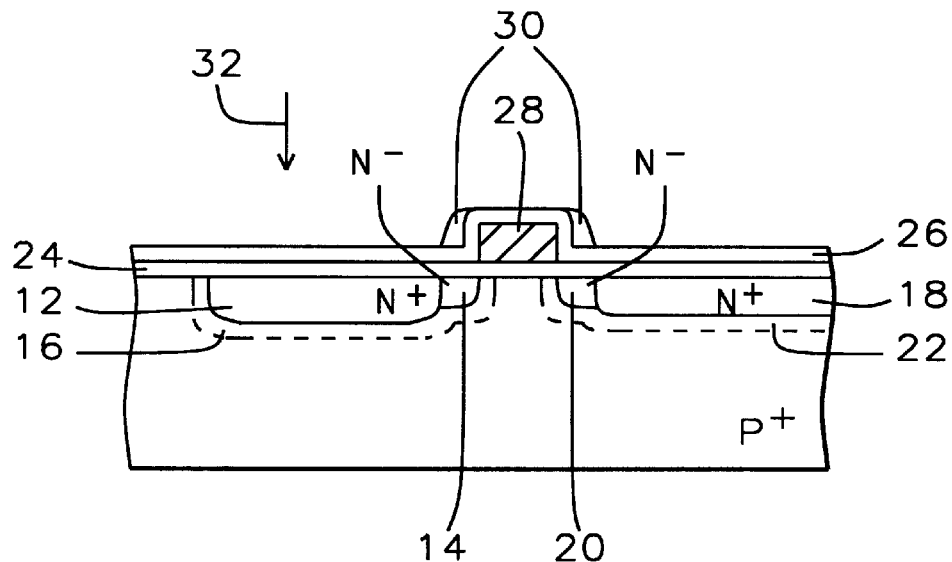
FIG. 1 – Prior Art
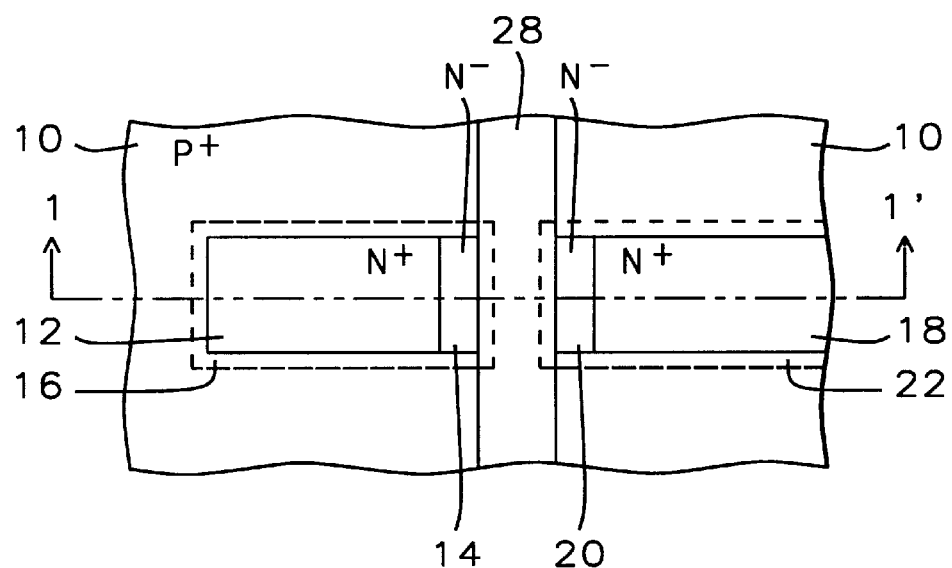
FIG. 2 – Prior Art

LAYOUT OF AN IMAGE SENSOR FOR INCREASING PHOTON INDUCED CURRENT

BACKGROUND OF THE INVENTION (1) Field of the Invention

This invention relates to a layout of a metal oxide semiconductor, MOS, image sensor which will increase photon induced current and more particularly to increasing the area of the depletion region seen by a photon stream.

(2) Description of the Related Art

Image sensors are useful in a number of applications. These image sensors use the energy of a photon to create an electron-hole pair or to change charge distribution in a way that can be detected and related to incoming light. It is of general interest to have the image sensors operate as efficiently as possible.

U.S. Pat. No. 4,590,327 to Nath et al. describes a grid type electrode pattern for use in a photovoltaic device.

U.S. Pat. No. 5,789,263 to Kuo et al. describes an amorphous silicon color detector using different bias voltages to detect different colors.

U.S. Pat. No. 5,426,060 to Kawahara et al. describes a method of inspecting image sensors formed on a semiconductor wafer using a grove cut in the surface of the wafer to separate the characteristics of one sensor from another.

U.S. Pat. No. 5,424,223 to Hynecek describes a semiconductor image sensor using potential wells to store charge. Light incident on the device modulates the charge stored in the potential wells which. This charge modulation is detected to provide an image sensor.

U.S. Pat. No. 5,270,221 to Garcia et al. describes a method for fabricating thinned back-illuminate solid state image sensors.

SUMMARY OF THE INVENTION

MOS, metal oxide semiconductor, image sensors find usefulness in a number of different applications. MOS image sensors detect increase in current due to hole electron pairs generated in the drain region by the energy of incident photons. The depletion region at PN junctions are the most important regions of the image sensors because hole electron pairs generated in the depletion regions have the greatest contribution to the sensor current.

FIGS. 1 and 2 show cross section and top views of a MOS image sensor having a conventional layout. FIG. 1 shows a cross section of the image sensor taken along line 1–1' of FIG. 2. FIGS. 1 and 2 show a drain region 12, a source region 18, a lightly doped drain region 14, and a lightly doped source region 20. There is a depletion region 16 at the junction between the P+ type substrate 10 and the N+ type drain 12 and the P+ type substrate 10 and the N− type lightly doped drain 14. There is also a depletion region 22 at the junction between the P+ type substrate 10 and the N+ type source 18 and the P+ type substrate 10 and the N− type lightly doped source 20. FIG. 1 also shows a gate electrode 28, a layer of gate oxide 24, a layer of nitride 26, and spacers 30 used in forming the lightly doped drain region 14 and the lightly doped source region 20 but these regions are not shown in FIG. 2 so that the junctions and depletion regions, important in the operation of the image sensor, are not obscured.

FIG. 1 shows an incident light beam 32 providing a stream of photons incident on the drain of the MOS image sensor. These photons generate hole electron pairs which provide sensor current. The depletion region at the drain PN junction 16 is the most important region of the MOS image sensors because hole electron pairs generated in this depletion region 16 have the greatest contribution to the sensor current. Increasing the amount of the depletion region at the drain 16 seen by the photon stream 32 will increase sensor current and make the sensor more sensitive and useful.

It is a primary objective of this invention to provide a layout for a MOS image sensor which will increase the depletion region seen by the photon stream.

This objective is achieved by using a layout of a MOS drain region having a shape which increases the amount of the depletion region seen by the photon stream, such as a number of fingers, a comb like structure, a spiral structure, or the like.

BRIEF DESCRIPTION OF THE DRAWINGS

FIG. 1 shows a cross section view of a conventional NMOS image sensor.

FIG. 2 shows a top view of a conventional NMOS image sensor.

DESCRIPTION OF THE PREFERRED EMBODIMENTS

Refer now to FIGS. 3–10 for the preferred embodiments of the device layouts of this invention. This invention will describe the design of a drain region in a NMOS, N channel metal oxide semiconductor, device, however those skilled in the art will readily recognize that the design can also be used in the source region or in both the source and drain regions. Those skilled in the art will also recognize that the layouts of this invention can also be used in PMOS, P channel metal oxide semiconductor, devices by replacing P+ type material with N+ type material, N+ type material with P+ type material, and N− type material with P− type material. Those skilled in the art will also recognize that the layouts of this invention can also be used in CMOS image sensors.

Figure 3:
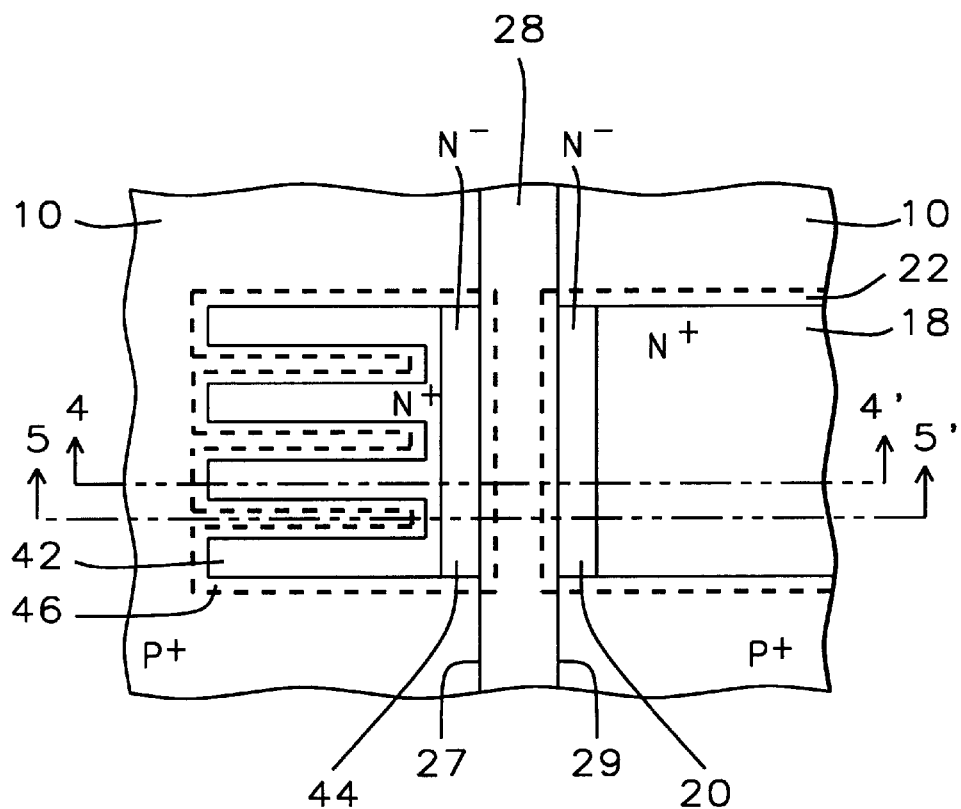
FIG. 3 shows a top view of an NMOS image sensor having a number of fingers forming the drain region.
Figure 4:
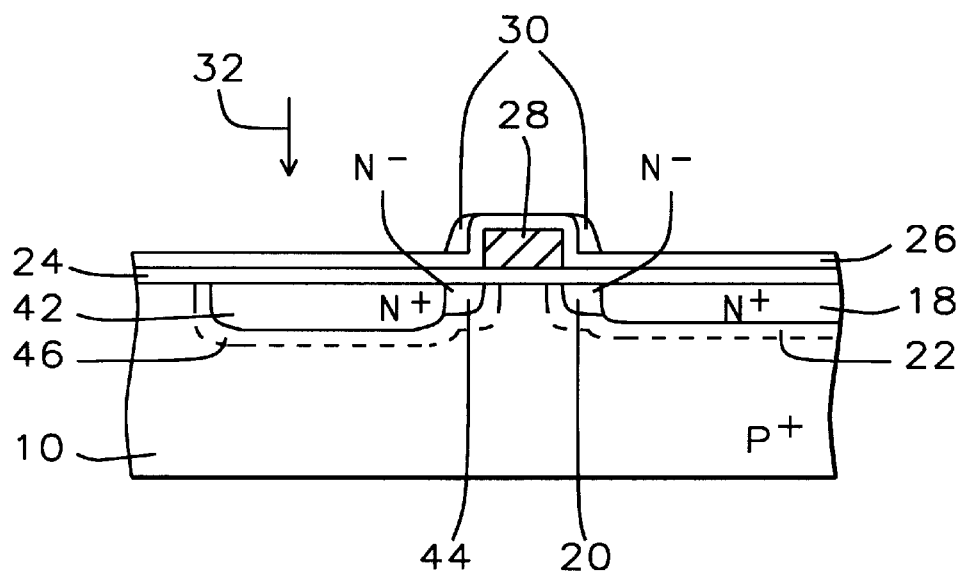
FIG. 4 shows a cross section view of the NMOS image sensor of FIG. 3 taken along line 4–4' of FIG. 3.
Figure 5:
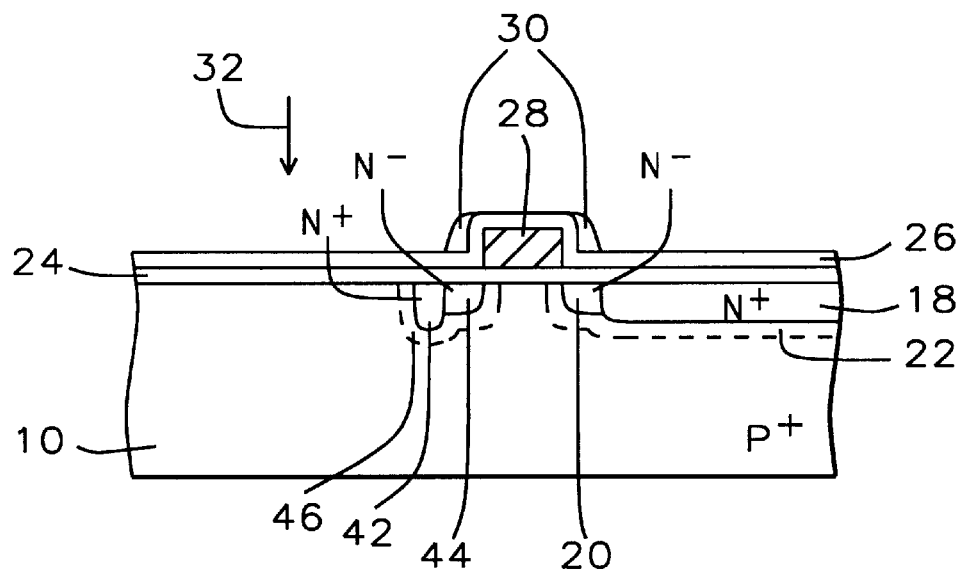
FIG. 5 shows a cross section view of the NMOS image sensor of FIG. 3 taken along line 5–5' of FIG. 3.

The first layout embodiment of this invention is shown in FIGS. 3–5. FIG. 3 shows a top view of a drain region 42 of an NMOS structure. FIG. 3 shows a gate electrode 28 having a first edge 27 and a second edge 29 with a lightly doped drain region 44 formed adjacent to the first edge 27 of the gate electrode 28 in the semiconductor substrate 10, as it is in the conventional layout shown in FIGS. 1 and 2. The drain region 42, formed in the semiconductor substrate 10, has a base segment adjacent to and in contact with the lightly doped drain region 44 and a number of parallel fingers, in this example four, perpendicular to the first edge 27 of the gate electrode 28. Other numbers of fingers, for example three or five, could also be used. This layout significantly increases the area of the drain depletion region 46 illuminated by a photon stream 32 perpendicular to the device surface, see FIGS. 4 and 5. In this example the gate electrode 28 is polysilicon, however other conductor materials can be used.

As shown in FIG. 3 a lightly doped source region 20 is formed adjacent to the second edge 29 of the gate electrode 28 and the source region 18 is adjacent to and in contact with the lightly doped source region 20. The lightly doped source region 20, the source region 18, and the source depletion region 22 are the same as in the conventional layout shown in FIGS. 1 and 2. In this example the lightly doped drain 44 and lightly doped source 20 are N⁻ type silicon, the drain 42 and source 18 are N⁺ type silicon, and the semiconductor substrate 10 is P⁺ type silicon forming an N channel device. Those skilled in the art will recognize that the lightly doped drain 44 and lightly doped source 20 could be P⁻ type silicon, the drain 42 and source 18 could be P⁺ type silicon, and the semiconductor substrate 10 could be N⁺ type silicon forming a P channel device. A CMOS structure could also be used.

FIG. 4 shows a cross section view of the device layout of FIG. 3 taken along line 4–4' of FIG. 3. FIG. 5 shows a cross section view of the device layout of FIG. 3 taken along line 5–5' of FIG. 3. FIGS. 4 and 5 also show a layer of gate oxide 24 and a layer of nitride 26 formed on the device. Oxide spacers 30 are formed at the edges of the gate electrode and are used in the formation of the lightly doped drain region 44 and the lightly doped source region 20. The layer of gate oxide 24, layer of nitride 26, and oxide spacers 30 are not shown in FIG. 3 to make the key layout features more visible in FIG. 3. FIGS. 4 and 5 show a photon stream 32 illuminating the surface of the device.

Figure 6:
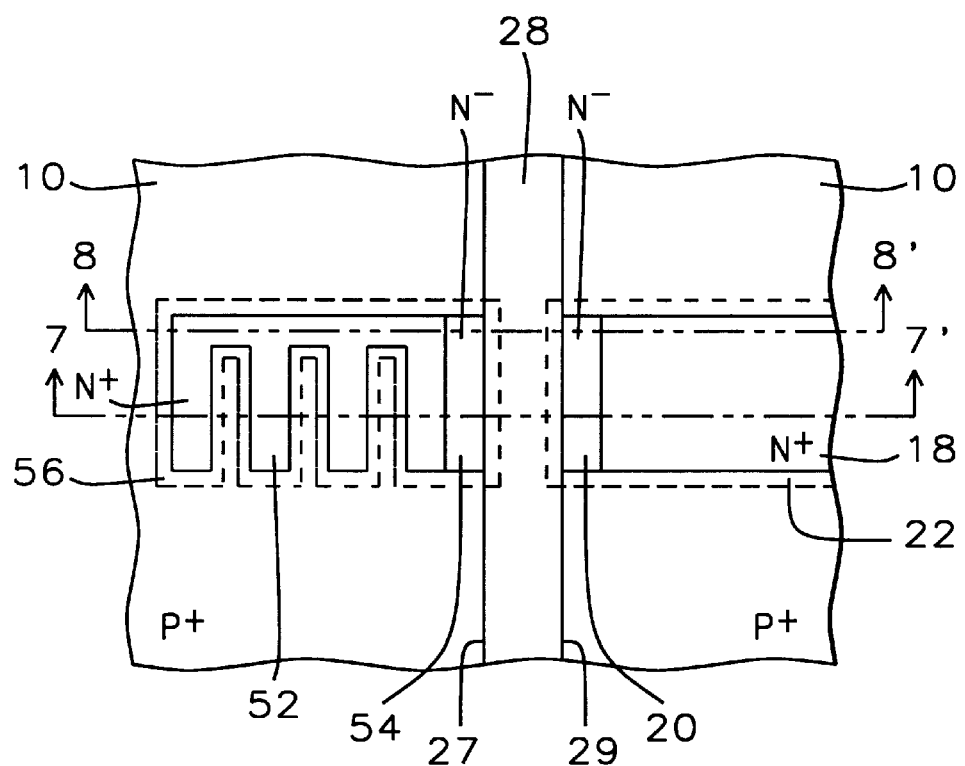
FIG. 6 shows a top view of an NMOS image sensor having a comb shaped drain region.
Figure 7:
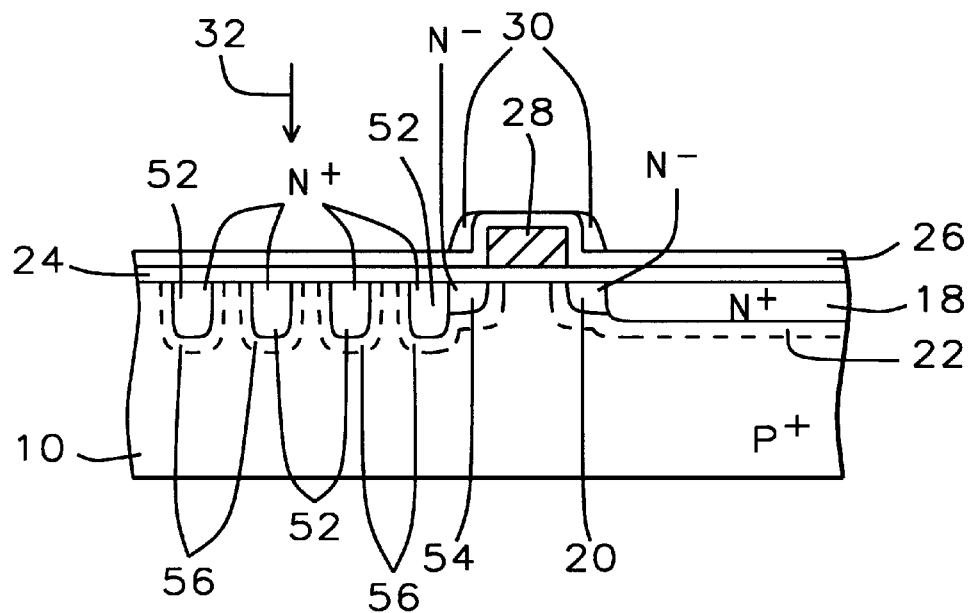
FIG. 7 shows a cross section view of the NMOS image sensor of FIG. 6 taken along line 7–7' of FIG. 6.
Figure 8:
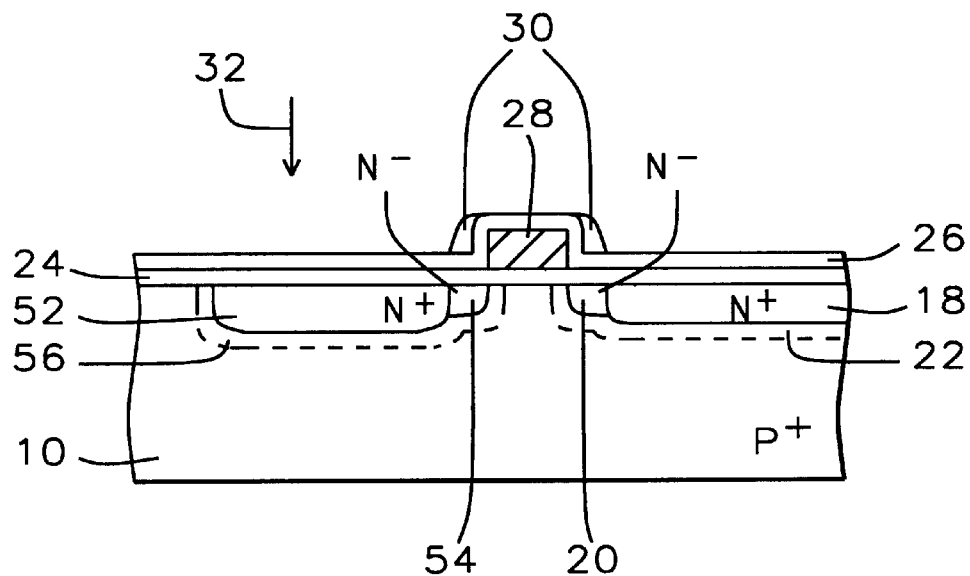
FIG. 8 shows a cross section view of the NMOS image sensor of FIG. 6 taken along line 8–8' of FIG. 6.

Another layout embodiment of this invention is shown in FIGS. 6–8. FIG. 6 shows a top view of a drain region 52 of an NMOS structure. FIG. 6 shows a gate electrode 28 having a first edge 27 and a second edge 29 with a lightly doped drain region 54 formed adjacent to the first edge 27 of the gate electrode 28 in the semiconductor substrate 10, as it is in the conventional layout shown in FIGS. 1 and 2. The drain region 52, formed in the semiconductor substrate 10, has a number of parallel fingers, in this example four, parallel to the first edge 27 of the gate electrode 28 wherein one of the fingers is adjacent to and in contact with the lightly doped drain region 54. Other numbers of fingers could also be used, for example three or five. The drain region 52 has a base segment perpendicular to the parallel fingers and serves to connect the fingers together. This layout significantly increases the area of the drain depletion region 56 illuminated by a photon stream 32 perpendicular to the device surface, see FIGS. 7 and 8. In this example the gate electrode 28 is polysilicon, however other conductor materials can be used.

As shown in FIG. 6 a lightly doped source region 20 is formed adjacent to the second edge 29 of the gate electrode 28 and a source region 18 formed adjacent to and in contact with the lightly doped source region 20. The lightly doped source region 20, the source region 18, and the source depletion region 22 are the same as in the conventional layout shown in FIGS. 1 and 2. In this example the lightly doped drain 54 and the lightly doped source 20 are N⁻ type silicon, the drain 52 and source 18 are N⁺ type silicon, and the semiconductor substrate 10 is P⁺ type silicon forming an N channel device. Those skilled in the art will recognize that the lightly doped drain 54 and lightly doped source 20 could be P⁻ type silicon, the drain 52 and source 18 could be P⁺ type silicon, and the semiconductor substrate 10 could be N⁺ type silicon forming a P channel device. A CMOS structure could also be used.

FIG. 7 shows a cross section view of the device layout of FIG. 6 taken along line 7–7' of FIG. 6. FIG. 8 shows a cross section view of the device layout of FIG. 6 taken along line 8–8' of FIG. 6. FIGS. 7 and 8 also show a layer of gate oxide 24 and a layer of nitride 26 formed on the device. Oxide spacers 30 are formed at the edges of the gate electrode and are used in the formation of the lightly doped drain region 54 and the lightly doped source region 20. The layer of gate oxide 24, layer of nitride 26, and oxide spacers 30 are not shown in FIG. 6 to make the key layout features more visible in FIG. 6. FIGS. 7 and 8 show a photon stream 32 illuminating the surface of the device.

Figure 9:
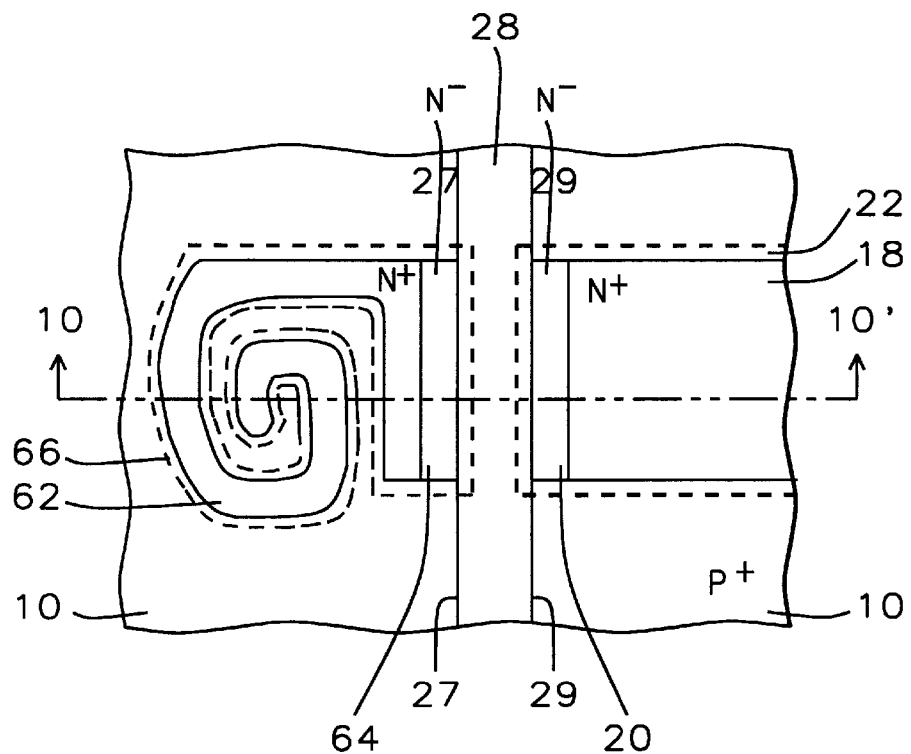
FIG. 9 shows a top view of an NMOS image sensor having a spiral shaped drain region.
Figure 10:
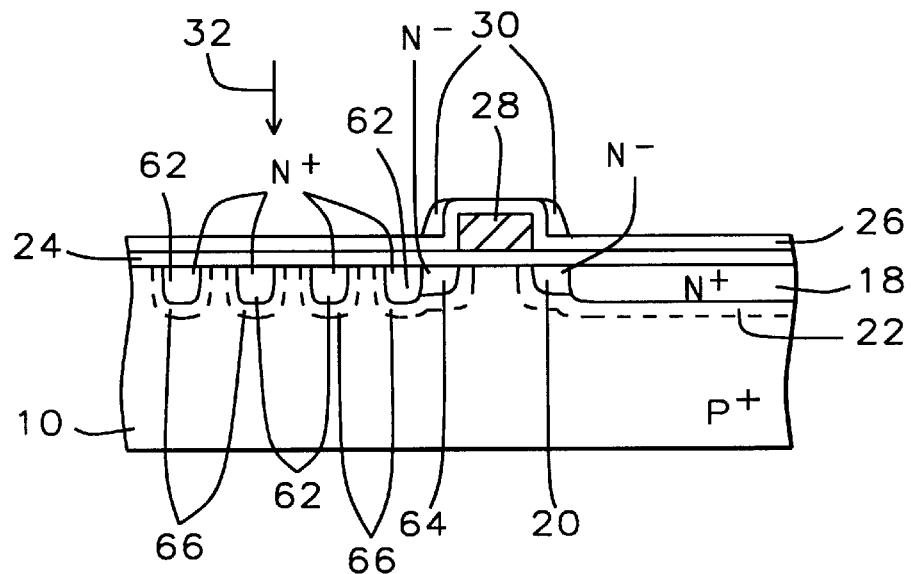
FIG. 10 shows a cross section view of the NMOS image sensor of FIG. 9 taken along line 10–10' of FIG. 9.

Another layout embodiment of this invention is shown in FIGS. 9 and 10. FIG. 9 shows a top view of a drain region 62 of an NMOS structure. FIG. 9 shows a gate electrode 28 having a first edge 27 and a second edge 29 with a lightly doped drain region 64 formed adjacent to the first edge 27 of the gate electrode 28 in the semiconductor substrate 10, as it is in the conventional layout shown in FIGS. 1 and 2. The drain region 62, formed in the semiconductor substrate 10, has a base segment adjacent to and in contact with the lightly doped drain region 64 and a spiral segment extending from the base segment. This layout significantly increases the area of the drain depletion region 66 illuminated by a photon stream 32 perpendicular to the device surface, see FIG. 10. In this example the gate electrode 28 is polysilicon, however other conductor materials can be used.

As shown in FIG. 9 a lightly doped source region 20 is formed adjacent to the second edge 29 of the gate electrode 28 and the source region 18 is adjacent to and in contact with the lightly doped source region 20. The lightly doped source region 20, the source region 18, and the source depletion region 22 are the same as in the conventional layout shown in FIGS. 1 and 2. In this example the lightly doped drain 64 and lightly doped source 20 are N⁻ type silicon, the drain 62 and source 18 are N⁺ type silicon, and the semiconductor substrate 10 is P⁺ type silicon forming an N channel device. Those skilled in the art will recognize that the lightly doped drain 64 and lightly doped source 20 could be P⁻ type silicon, the drain 62 and source 18 could be P⁺ type silicon, and the semiconductor substrate 10 could be N⁺ type silicon forming a P channel device. A CMOS structure could also be used.

FIG. 10 shows a cross section view of the device layout of FIG. 9 taken along line 10–10' of FIG. 9. FIG. 10 also shows a layer of gate oxide 24 and a layer of nitride 26 formed on the device. Oxide spacers 30 are formed at the edges of the gate electrode and are used in the formation of the lightly doped drain region 64 and the lightly doped source region 20. The layer of gate oxide 24, layer of nitride 26, and oxide spacers 30 are not shown in FIG. 9 to make the key layout features more visible in FIG. 9. FIG. 10 shows a photon stream 32 illuminating the surface of the device.

While the invention has been particularly shown and described with reference to the preferred embodiments thereof, it will be understood by those skilled in the art that various changes in form and details may be made without departing from the spirit and scope of the invention.

What is claimed is:

1. An image sensor, comprising:

a semiconductor substrate having a first polarity;

a layer of gate oxide formed on said semiconductor substrate;

a gate electrode having a first edge and a second edge;

a first region formed in said semiconductor substrate, wherein said first region is doped to have a polarity opposite the polarity of said semiconductor substrate, said first region has a base segment and a plurality of fingers, said base segment of said first region is parallel to said first edge of said gate electrode, each of said fingers has two parallel sides and two parallel ends, said parallel sides of each of said fingers are parallel to each other and perpendicular to said base segment, one of said ends of each of said fingers contacts said base segment, and both of said parallel sides and one of said parallel ends of each of said fingers contacts a part of said semiconductor substrate having said first polarity; and a second region formed in said semiconductor substrate, wherein said second region is doped to have a polarity opposite the polarity of said semiconductor substrate, and said gate electrode is located between said first region and said second region.

2. The image sensor of claim 1 wherein said semiconductor substrate is $P^+$ type silicon.

3. The image sensor of claim 1 wherein said first region is $N^+$ type silicon.

4. The image sensor of claim 1 wherein said second region is $N^+$ type silicon.

5. The image sensor of claim 1 wherein said gate electrode is polysilicon.

6. The image sensor of claim 1, further comprising:

a first lightly doped region doped to have the same polarity as said first region, located between said first edge of said gate electrode and said base segment of said first region, located adjacent to said first edge of said gate electrode, and located adjacent to said base segment of said first region; and a second lightly doped region doped to have the same polarity as said second region, located between said second edge of said gate electrode and said second region, located adjacent to said first edge of said gate electrode, and located adjacent to said second region.

7. The image sensor of claim 6 wherein said first lightly doped region and said second lightly doped region are $N^-$ silicon.

8. An image sensor, comprising:

a semiconductor substrate having a first polarity;

a layer of gate oxide formed on said semiconductor substrate;

a gate electrode having a first edge and a second edge;

a first region formed in said semiconductor substrate, wherein said first region is doped to have a polarity opposite the polarity of said semiconductor substrate, said first region has a base segment and a number of fingers, said base segment of said first region is perpendicular to said first edge of said gate electrode, and said fingers are parallel to each other and perpendicular to said base segment; and a second region formed in said semiconductor substrate, wherein said second region is doped to have a polarity opposite the polarity of said semiconductor substrate, and said gate electrode is located between said first region and said second region.

9. The image sensor of claim 8 wherein said semiconductor substrate is $P^+$ type silicon.

10. The image sensor of claim 8 wherein said first region is $N^+$ type silicon.

11. The image sensor of claim 8 wherein said second region is $N^+$ type silicon.

12. The image sensor of claim 8 wherein said gate electrode is polysilicon.

13. The image sensor of claim 8, further comprising:

a first lightly doped region doped to have the same polarity as said first region, located between said first edge of said gate electrode and said first region, located adjacent to said first edge of said gate electrode, and located adjacent to one of said fingers of said first region; and a second lightly doped region doped to have the same polarity as said second region, located between said second edge of said gate electrode and said second region, located adjacent to said first edge of said gate electrode, and located adjacent to said second region.

14. The image sensor of claim 13 wherein said first lightly doped region and said second lightly doped region are $N^-$ silicon.

15. An image sensor, comprising:

a silicon substrate having a first polarity;

a layer of gate oxide formed on said silicon substrate;

a gate electrode having a first edge and a second edge;

a first region formed in said silicon substrate, wherein said first region is doped to have a polarity opposite the polarity of said silicon substrate, said first region has a base segment and a spiral segment, said base segment of said first region has a first end and a second end and is parallel to said first edge of said gate electrode, and said spiral segment is attached to said first end of said base segment; and a second region formed in said silicon substrate, wherein said second region is doped to have a polarity opposite the polarity of said silicon substrate, and said gate electrode is located between said first region and said second region.

16. The image sensor of claim 15 wherein said silicon substrate is $P^+$ type silicon.

17. The image sensor of claim 15 wherein said first region is $N^+$ type silicon.

18. The image sensor of claim 15 wherein said second region is $N^+$ type silicon.

19. The image sensor of claim 15 wherein said gate electrode is polysilicon.

20. The image sensor of claim 15, further comprising:

a first lightly doped region doped to have the same polarity as said first region, located between said first edge of said gate electrode and said base segment of said first region, located adjacent to said first edge of said gate electrode, and located adjacent to said base segment of said first region; and a second lightly doped region doped to have the same polarity as said second region, located between said second edge of said gate electrode and said second region, located adjacent to said first edge of said gate electrode, and located adjacent to said second region.

21. The image sensor of claim 20 wherein said first lightly doped region and said second lightly doped region are $N^-$ type silicon.

* * * * *